(12) United States Patent
Sung

(10) Patent No.: US 8,619,233 B2
(45) Date of Patent: Dec. 31, 2013

(54) MASKLESS EXPOSURE APPARATUS AND PATTERN COMPENSATION METHOD USING THE SAME

(75) Inventor: Jeong Hyoun Sung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 440 days.

(21) Appl. No.: 12/926,514

(22) Filed: Nov. 23, 2010

(65) Prior Publication Data

US 2011/0134407 A1 Jun. 9, 2011

(30) Foreign Application Priority Data

Dec. 8, 2009 (KR) ........................ 10-2009-0120917

(51) Int. Cl.
- *G03B 27/54* (2006.01)
- *G03B 27/44* (2006.01)
- *G03B 27/68* (2006.01)
- *G03B 27/58* (2006.01)
- *G03B 27/32* (2006.01)
- *G03B 27/42* (2006.01)

(52) U.S. Cl.
USPC ............... 355/67; 355/46; 355/52; 355/53; 355/72; 355/77

(58) Field of Classification Search
USPC .......... 355/46, 52, 53, 55, 67–71, 72–74, 77; 250/492.1, 492.2, 492.22, 548; 356/399–401
See application file for complete search history.

(56) References Cited

U.S. PATENT DOCUMENTS

| | | | | |
|---|---|---|---|---|
| 5,200,798 | A * | 4/1993 | Katagiri et al. | 356/508 |
| 6,072,184 | A * | 6/2000 | Okino et al. | 250/492.2 |
| 6,359,678 | B1 * | 3/2002 | Ota | 355/53 |
| 2003/0031365 | A1 * | 2/2003 | Okuyama | 382/194 |
| 2003/0222966 | A1 * | 12/2003 | Shirota et al. | 347/239 |
| 2005/0168754 | A1 * | 8/2005 | Hill | 356/500 |
| 2009/0115981 | A1 * | 5/2009 | Mushano | 355/52 |

* cited by examiner

*Primary Examiner* — Toan Ton
*Assistant Examiner* — Christina Riddle
(74) *Attorney, Agent, or Firm* — Harness, Dickey & Pierce

(57) ABSTRACT

Disclosed herein is a method of compensating for distortion of an exposure pattern due to stage yawing in a maskless exposure apparatus using digital micromirror devices (DMDs). Requirements as to control performance of the stage yawing through the adjustment of sync signals (PEGs) to switch frames of the DMDs are eliminated, thereby reducing manufacturing costs of a large-sized stage. Also, distortion of an exposure pattern, which may occur due to uncompensated yawing, is digitally compensated by controlling the stage yawing, thereby achieving high-quality exposure.

13 Claims, 6 Drawing Sheets

MASKLESS EXPOSURE APPARATUS AND PATTERN COMPENSATION METHOD USING THE SAME

CROSS-REFERENCE TO RELATED APPLICATION

This application claims priority under 35 U.S.C. §119 to Korean Patent Application No. 2009-0120917, filed on Dec. 8, 2009 in the Korean Intellectual Property Office, the entire disclosure of which is incorporated herein by reference.

BACKGROUND

1. Field

Example embodiments relate to a method of compensating for distortion of an exposure pattern due to stage yawing in a maskless exposure apparatus using digital micromirror devices (DMDs).

2. Description of the Related Art

Generally, a pattern may be formed on a substrate constituting a liquid crystal display (LCD), a plasma display panel (PDP) and/or a flat panel display (FPD) by applying a pattern material to the substrate and selectively exposing the pattern material using a photomask to selectively remove the portion of the pattern material whose chemical properties have been changed or the remaining portion of the pattern material.

With the increase in size of a substrate and the precision of a pattern, a maskless exposure apparatus that forms a pattern on the substrate without using a photomask is under development. The maskless exposure apparatus forms a pattern by transferring light beams to the substrate according to pattern information created by an electric signal from an electronic device, for example, a digital micromirror device (DMD). The DMD includes a plurality of micro minors by which incident light having given angles is transmitted with desired angles, and other light is transmitted with other angles, thereby exposing a pattern on an exposed surface using the selected light.

The maskless exposure apparatus using the DMD changes a DMD image (frame) at predetermined/desired intervals, when a stage to move the substrate is scanned in an exposure direction at predetermined/desired speed, to expose the pattern on the exposed surface. At this time, the predetermined/desired intervals are maintained through synchronization with pulses generated at predetermined/desired intervals by a timer of the stage. The position of the stage, referred to as a position event generator (PEG, hereinafter referred to as a sync signal), is generally used. In the maskless exposure apparatus, however, exposure continuously occurs during scanning, with the result that distortion of an exposure pattern due to stage yawing occurs, which directly affects exposure quality. Particular with the development of technology, the size of the substrate has gradually increased, and therefore, the size of the stage has increased. As a result, stage yawing becomes more severe. Conventional methods of minimizing such stage yawing have been proposed; however, minimizing the yawing is limited when the stage is large.

SUMMARY

According to example embodiments, a maskless exposure apparatus includes a plurality of digital micromirror devices (DMDs) configured to selectively irradiate light on a substrate according to pattern information; a stage configured to move the substrate in a scanning direction; a position measurement unit configured to measure a position of the stage according to movement of the substrate; and a sync signal generation unit configured to generate sync signals (PEGs) to adjust drive timings of the DMDs according to the position of the stage.

According to example embodiments, the position measurement unit includes a plurality of laser interferometers configured to measure left and right side positions of the stage.

According to example embodiments, the sync signal generation unit averages position counters measured by the laser interferometers and acquires middle position data of the stage and periodically generates the sync signals (PEGs) using the middle position data of the stage.

According to example embodiments, the sync signal generation unit calculates a yawing amount of the stage based on a difference between position counters measured by the laser interferometers and calculates a compensation amount for by the respective DMDs.

According to example embodiments, the sync signal generation unit generates a same number of sync signals (PEGs) as the DMDs, adjusts generation intervals of the sync signals based on the calculated compensation amount, and transmits the sync signals having the adjusted generation intervals to the respective DMDs.

According to example embodiments, the sync signal generation unit compares an increment of the calculated compensation amount with an increment of the laser interferometers and determines whether intervals of the sync signals (PEGs) require adjustment.

According to example embodiments, the DMDs receive different sync signals (PEGs) from the sync signal generation unit to switch frames of the DMDs at different positions.

According to example embodiments, a pattern compensation method of a maskless exposure apparatus includes moving a stage having a substrate located thereon in a scanning direction; measuring a position of the stage to calculate a yawing amount of the stage; adjusting intervals of sync signals (PEGs) to drive a plurality of digital micromirror devices (DMDs) according to the yawing amount of the stage; and transmitting the sync signals having the adjusted intervals to the DMDs to expose a pattern on the substrate.

According to example embodiments, measuring the position of the stage includes measuring left and right position data of the stage using a plurality of laser interferometers.

According to example embodiments, calculating the yawing amount of the stage includes calculating the yawing amount of the stage based on a difference between left and right position counters of the stage to calculate a compensation amount for by the DMDs.

According to example embodiments, exposing the pattern on the substrate includes adjusting driving timings of the DMDs according to the intervals of the sync signals to prevent distortion of the exposure pattern.

According to example embodiments, the DMDs receive the sync signals (PEGs) having the adjusted intervals and switch frames thereof to prevent distortion of the exposure pattern due to the yawing of the stage.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
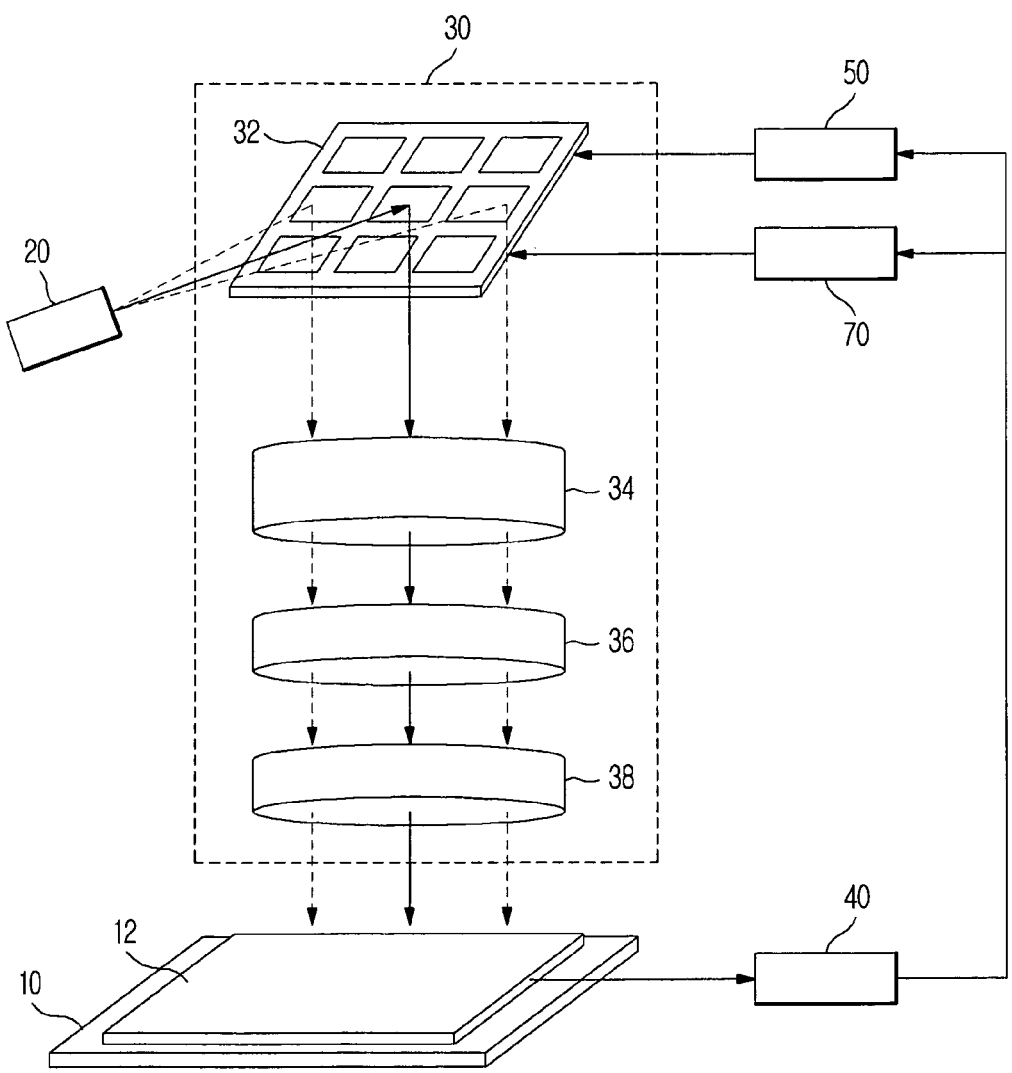
FIG. 1 is a schematic construction view illustrating a maskless exposure apparatus according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a schematic construction view illustrating a maskless exposure apparatus 1 according to example embodiments.

Referring to FIG. 1, the maskless exposure apparatus 1 includes a stage 10, a light source 20, an exposure unit 30, a position measurement unit 40, a sync signal generation unit 50 and a pattern provision unit 70.

A substrate (wafer or glass on which a desired pattern is to be formed) 12 to be exposed is placed on the stage 10. Light emitted from the exposure unit 30 moves in a scanning direction parallel to the top of the stage 10 such that the light is scanned from one side to the other side of the substrate 12 along the surface of the substrate 12.

The light source 20 transmits light, for example, a laser, for exposure to the exposure unit 30. The light source 20 includes a semiconductor laser and an optical system to control laser light emitted from the semiconductor laser.

The exposure unit 30 modulates the laser light emitted from the light source 20 according to predetermined/desired pattern information (image data) and selectively irradiates the modulated laser light on the substrate 12. The exposure unit 30 includes digital micromirror devices (DMD) 32 to selectively irradiate light without using a separate mask, a first projection lens 34, a micro lens array 36, and a second projection lens 38.

Each of the DMDs 32 includes a plurality of micro mirrors arranged such that angles of the micro mirrors may be adjusted. The angles of the respective micro mirrors are different from one another such that incident light having given angles is transmitted with desired angles, and other light is transmitted with other angles, thereby selectively reflecting the light according the desired pattern information.

The light reflected from the DMDs 32 passes through the first projection lens 34 provided below the DMDs 32. The light is magnified by the first projection lens 34. The light, having passed through the first projection lens 34, passes through the micro lens array 36 provided below the first projection lens 34. The light is condensed into a predetermined/desired size by the micro lens array 36. The light, having passed through the micro lens array 36, passes through the second projection lens 38 provided below the micro lens array 36. Resolution of the light is adjusted and the light is irradiated on the substrate 12 by the second projection lens 38.

The position measurement unit 40 monitors movement of the stage 10 to measure the position of the stage 10 moving at scanning intervals. The position measurement is performed using a linear scaler or a laser interferometer. Position signals are generated as pulse signals and/or sine wave signals. With movement of the stage 10, the position signals are generated at predetermined/desired intervals, and are transmitted to the sync signal generation unit 50 and the pattern provision unit 70.

When position signals from the position measurement unit 40 are transmitted to the sync signal generation unit 50, the sync signal generation unit 50 generates sync signals (PEGs) to control drive timings of the DMDs 32, i.e., frame switching of the DMDs 32. The same number of sync signals (PEGs) is generated as the number of DMDs 32. The sync signals are distributed such that a sync signal (PEG) is transmitted to each DMD 32. The sync signals have the same cycle but different phase differences. The sync signals having the same cycle but different phase differences are transmitted to the respective DMDs 32 to switch drive timings, i.e., the frames of the DMDs 32.

The sync signals (PEGs) are pulse signals synchronized with the frame conversion of the DMDs 32. The sync signals are generated at predetermined/desired positions according to the scanning direction of the stage 10. Synchronously, the frames of the DMDs 32 are converted (switched) to perform exposure.

The pattern provision unit 70 allows a user to input pattern information to be formed on the substrate 12 and provides the input pattern information to the DMDs 32. When the position signals from the position measurement unit 40 are transmitted to the pattern provision unit 70, the pattern provision unit 70 provides the pattern information to the DMDs 32 while being synchronized with the position signals according to the cycles to convert the frames of the DMDs 32, for example, according to the scanning intervals of the stage 10.

Figure 2:
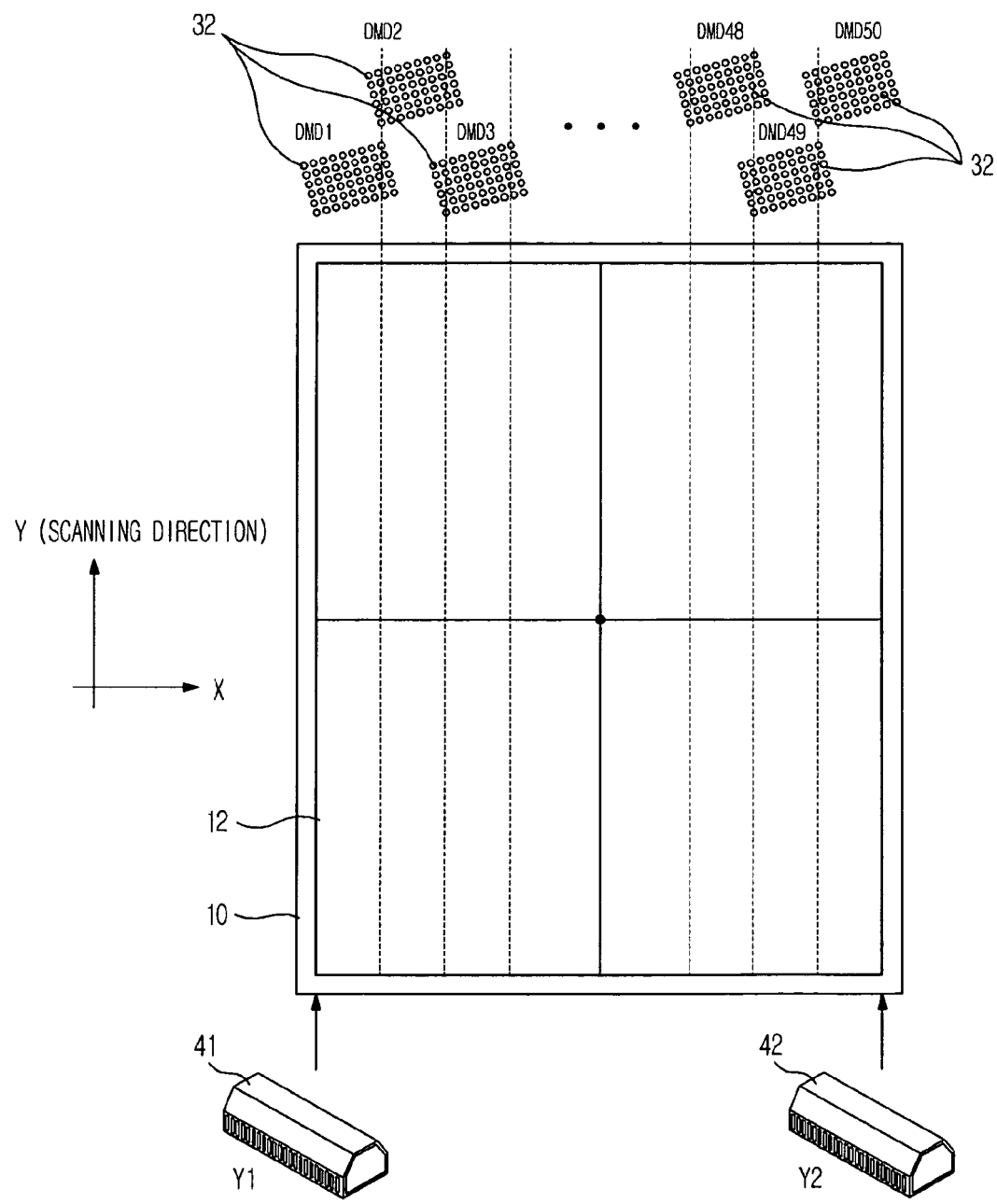
FIG. 2 is a view illustrating components of the maskless exposure apparatus according to example embodiments.

FIG. 2 is a view illustrating components of the maskless exposure apparatus according to example embodiments.

Referring to FIG. 2, the substrate 12 is located on the stage 10, and the stage 10 moves with respect to a plane parallel to the top thereof in a scanning direction (Y-axis direction).

A DMD array is provided above the stage 10 to irradiate light on the substrate 12. The DMD array includes a plurality of DMDs 32 to increase an exposure area. That is, the DMDs 32 stand in line along an X-axis of the stage 10. Also, DMD1 and DMD2 are alternately arranged in the direction in which the DMDs 32 are placed in line.

According to example embodiments, a head having fifty DMDs (DMD1 to DMD50) 32 are used to expose 8G glass by one time scanning. The number of the DMDs 32 is not fixed but may be changed depending upon exposure area or the size of the stage 10. Generally, the fifty DMDs (DMD1 to DMD50) 32 perform frame conversion based on the same sync signal (PEG). However, different sync signals (PEGs) are set based on performance of the stage, glass deformation, head misalignment, or the like.

The position measurement unit 40 is provided below/besides the stage 10 to monitor movement of the stage 10 to measure the position of the stage 10 moving at scanning intervals. The position measurement unit 40 controls the left and right sides of the stage 10 using first and second laser interferometers 41 and 42 to measure two positions, i.e., Y1 and Y2, thereby controlling yawing of a large-sized stage 10. When the stage 10 is large, however, control of the yawing is limited. For an 8G stage 10, yawing of several μm is generated. When a lateral pattern bundle is exposed, pattern intervals are not regular by such yawing, with the result that, as shown in FIG. 3, an exposure pattern is distorted.

Figure 3:
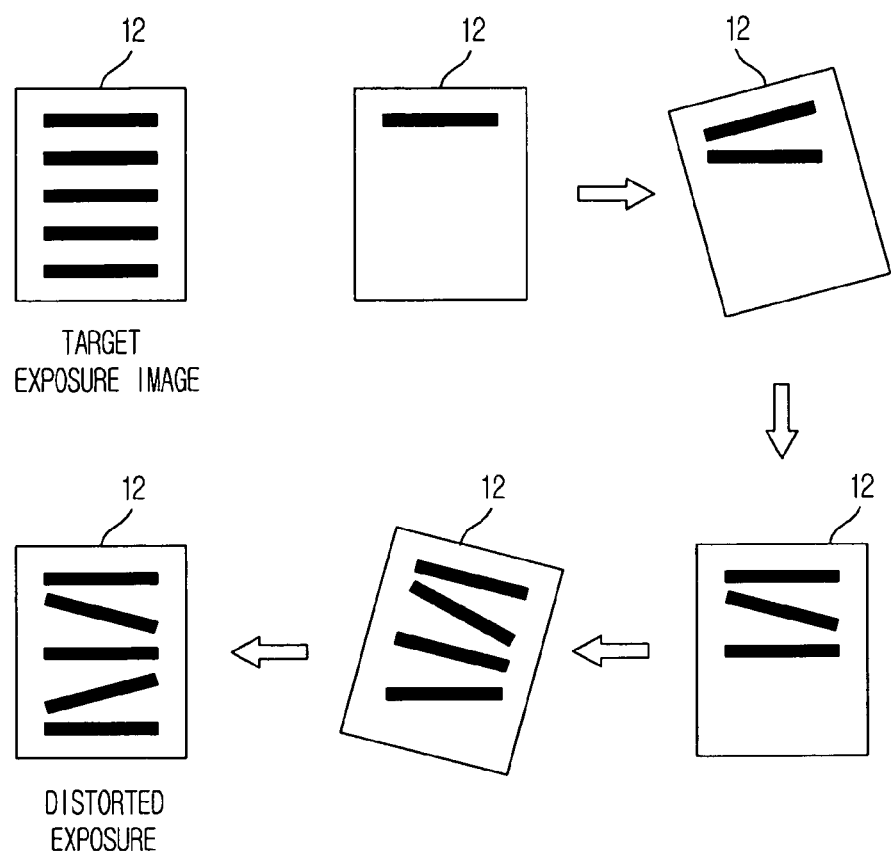
FIG. 3 is a view illustrating distortion of an exposure pattern caused by stage yawing in the maskless exposure apparatus according to example embodiments.

FIG. 3 is a view illustrating distortion of an exposure pattern caused by stage yawing in the maskless exposure apparatus according to example embodiments.

When a target image to be exposed is provided, the fifty DMDs (DMD1 to DMD50) 32 selectively irradiate light on the substrate 12 according to predetermined/desired pattern information to expose a pattern.

In the maskless exposure apparatus, exposure continuously occurs while the stage 10 is scanned in the scanning direction. For a large stage 10, therefore, the exposure pattern is distorted by yawing. This occurs as a result of controlling the fifty DMDs (DMD1 to DMD50) 32 at the same sync signal (PEG) interval.

Figure 4:
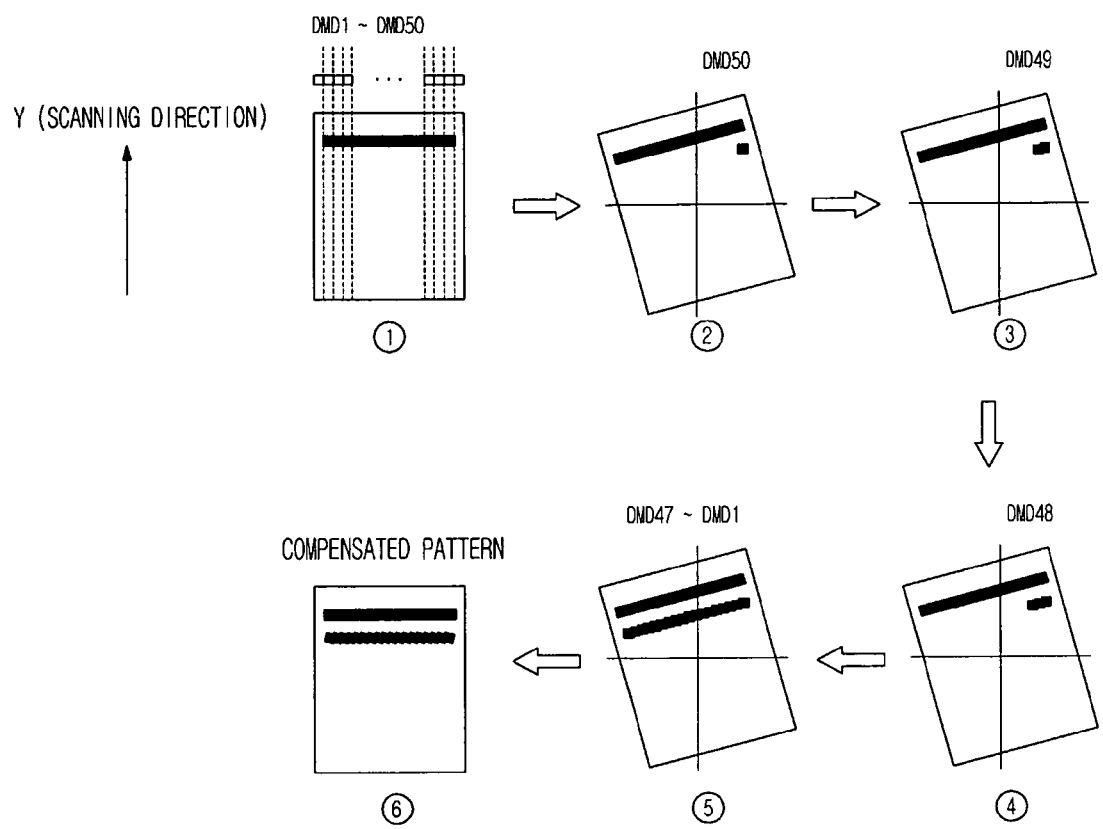
FIG. 4 is a view illustrating compensation for distortion of an exposure pattern in the maskless exposure apparatus according to example embodiments.

FIG. 4 is a view illustrating compensation for distortion of an exposure pattern in the maskless exposure apparatus according to example embodiments.

If the frames of the fifty DMDs (DMD1 to DMD50) 32 are equally switched at the same sync signal (PEG) interval when the stage 10 yaws counterclockwise based on the scanning direction (②), a pattern which is being formed tilts clockwise as compared to a previous pattern. To prevent this, DMDs (DMD50, DMD49, DMD48 . . . ) located at the right side of the stage 10 are switched relatively rapidly (②, ③, ④ and ⑤), thereby achieving a pattern tilting counterclockwise. As shown in FIG. ⑥ of FIG. 4, therefore, a compensated pattern is achieved. However, a tilting pattern is not completed at once as shown in FIG. 4, but the tilting pattern is achieved after a large number (tens of thousands) of sync signal (PEGs) cycles.

Figure 5:
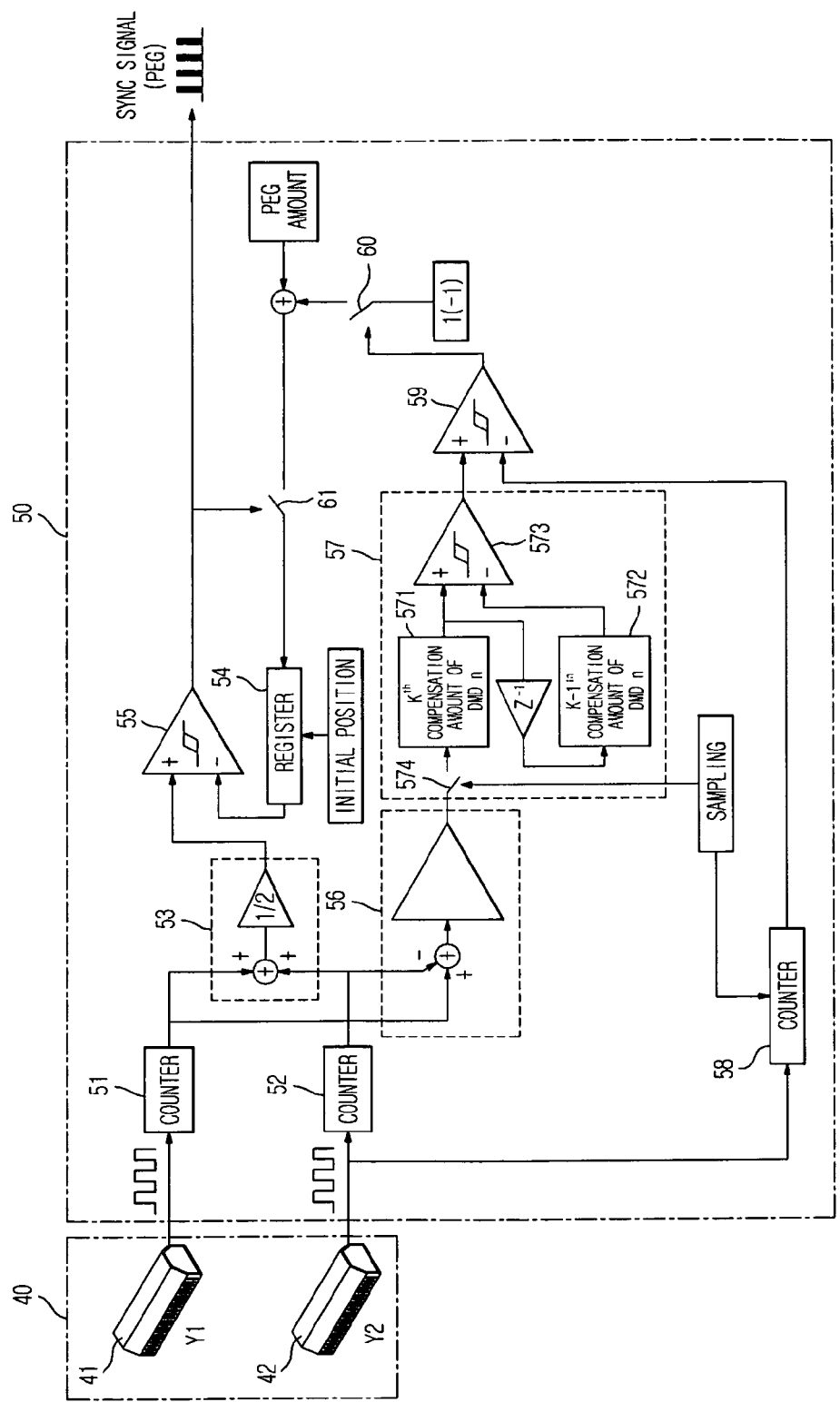
FIG. 5 is a control block diagram to compensate for distortion of an exposure pattern in the maskless exposure apparatus according to example embodiments.

FIG. 5 is a control block diagram to compensate for distortion of an exposure pattern in the maskless exposure apparatus according to example embodiments.

Referring to FIG. 5, Y1 and Y2 position data of the stage 10 are transmitted from the position measurement unit 40 to measure the position of the stage 10 to the sync signal generation unit 50 using the first and second interferometers 41 and 42.

The sync signal generation unit 50 includes first and second counters 51 and 52 to receive the Y1 and Y2 position data corresponding to the left and right sides of the stage 10 from the first and second laser interferometers 41 and 42, a position data converter 53 to average the Y1 and Y2 position data received through the first and second counters 51 and 52 to convert them into middle position data of the stage 10, a register 54 to store initial position data, increment (PEG amount), and final position data of sync signals (PEGs), and a first comparator 55 to compare the middle position data of the stage 10 acquired by the position data converter 53 with the position date stored in the register 54 to periodically generate sync signals (PEGs) at predetermined/desired positions along the scanning direction of the stage 10 until the stage 10 reaches the final position.

Also, the sync signal generation unit 50 includes a yawing amount calculation unit 56 to calculate a yawing amount of the stage to be compensated for by the respective DMDs (DMD1 to DMD50) 32 using the Y1 and Y2 position data received through the first and second counters 51 and 52, a compensation amount calculation unit 57 to calculate an increment of a compensation amount be compensated for by the respective DMDs (DMD1 to DMD50) 32 based on the yawing amount calculated by the yawing amount calculation unit 56, a third counter 58 to acquire an interferometer increment on the Y2 position data received from the second laser interferometer 42, a second comparator 59 to compare the increment of the compensation amount calculated by the compensation amount calculation unit 57 with the interferometer increment acquired by the third counter 58, a first update unit 60 to continue to perform compensation with the increment of the compensation amount when the interferometer increment is less than the increment of the compensation amount as a result of comparison of the second comparator and to stop compensation when the interferometer increment is greater than the increment of the compensation amount, and a second update unit 61 to generate sync signals with the increment of the compensation amount or an original increment (PEG amount) according to the result of the first update unit 60.

The compensation amount calculation unit 57 calculates the increment of the compensation amount using the yawing amount calculated by the yawing amount calculation unit 56. The compensation amount calculation unit 57 includes a current compensation amount storage unit 571 to store a current compensation amount ($K^{th}$ compensation amount) acquired based on the yawing amount calculated by the yawing amount calculation unit 56, a previous compensation amount storage unit 572 to store a compensation amount (K-1$^{th}$ compensation amount) before the current compensation amount, a third comparator 573 to calculate an increment of a compensation amount which has not been integrated by subtracting the previous compensation amount (K-1$^{th}$ compensation amount) from the current compensation amount (K$^{th}$ compensation amount), and a third update unit 574 to update a yawing cycle through sampling.

Hereinafter, the operation of the maskless exposure apparatus with the above-stated construction and a pattern compensation method using the same will be described.

Figure 6:
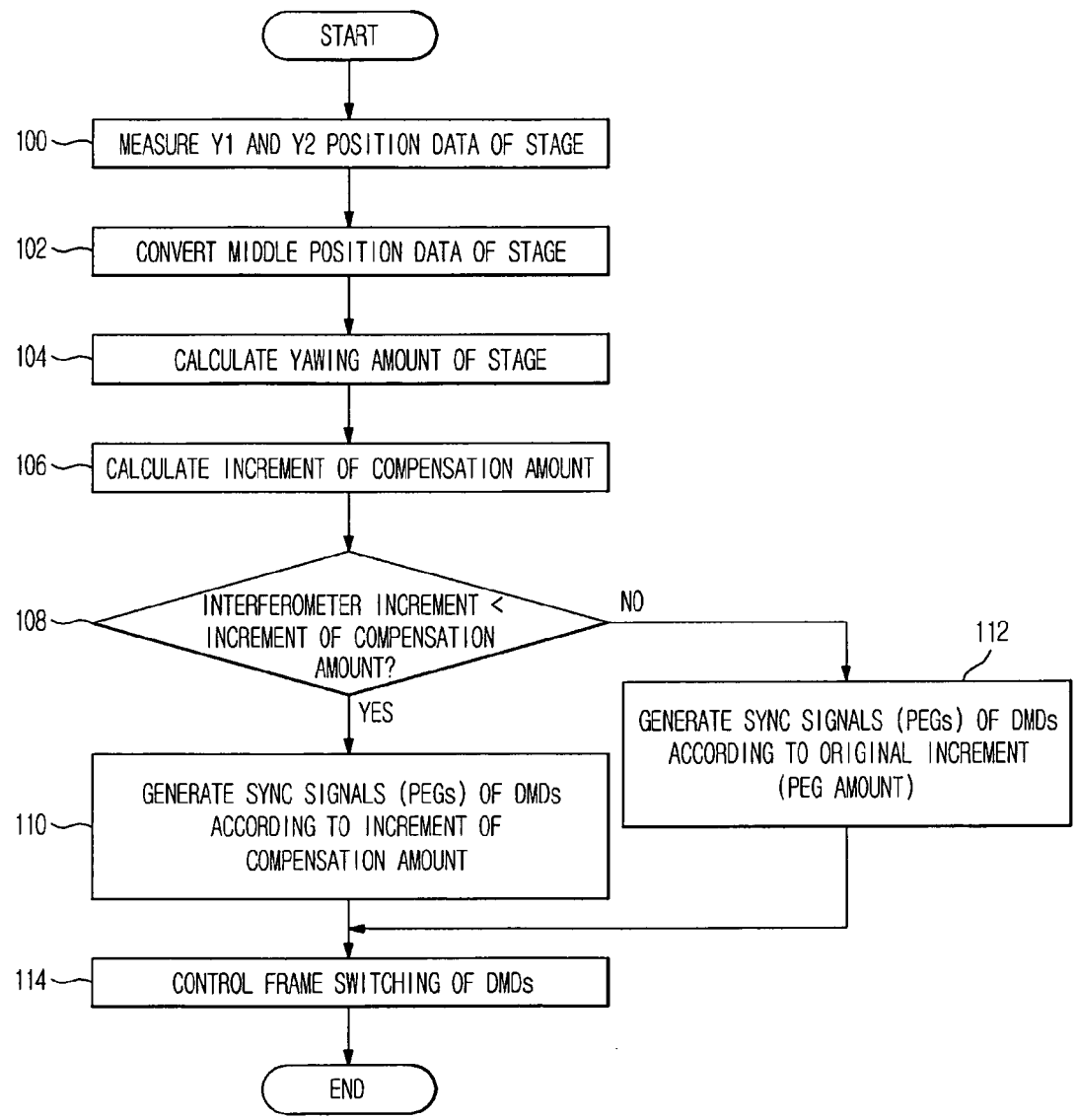
FIG. 6 is flow chart illustrating a control method to compensate for distortion of an exposure pattern in the maskless exposure apparatus according to example embodiments.

FIG. 6 is flow chart illustrating a control method to compensate for distortion of an exposure pattern in the maskless exposure apparatus according to example embodiments.

After a substrate 12 is located at the top of the stage 10, the stage 10 moves in the scanning direction. At this time, the position measurement unit 40, which measures the position of the stage moving at scanning intervals, measures Y1 and Y2 position data corresponding to the left and right sides of the stage 10 using the first and second laser interferometers 41 and 42 (100).

The Y1 and Y2 position data, corresponding to the left and right sides of the stage 10, measured by the first and second laser interferometers 41 and 42 are transmitted to the sync signal generation unit 50.

The position data converter 53 of the sync signal generation unit 50 averages the Y1 and Y2 position data, corresponding to the left and right sides of the stage 10, transmitted from the first and second laser interferometers 41 and 42 and received through the first and second counters 51 and 52 to convert them into middle position data of the stage 10 (102). The converted middle position data of the stage 10 periodically generate sync signals (PEGs) at predetermined/desired positions along the scanning direction of the stage 10. At this time, whenever positions are increased by an increment (PEG amount) according to the increment (PEG amount) by which the positions are gradually increased, sync signals (PEGs) are generated.

The yawing amount calculation unit 56 of the sync signal generation unit 50 calculates a yawing amount of the stage 10 to be compensated for by the respective DMDs (DMD1 to DMD50) 32 according to Equation 1 below (104) using the Y1 and Y2 position data, corresponding to the left and right sides of the stage 10, transmitted from the first and second laser interferometers 41 and 42 and received through the first and second counters 51 and 52.

$$\Delta Y n = |Y1-Y2| \times (n-0.5M-0.5)/N \quad \text{[Equation 1]}$$

Where, n is a corresponding DMD (1≤n≤N), and N is the number of DMDs.

For example, when the position counter difference between Y1 and Y2 is 100, the number of DMDs 32 is 50, the 50$^{th}$ DMD 32 has a compensation amount of 49, the 40$^{th}$ DMD 32 has a compensation amount of 47, and the first DMD 32 has a compensation amount of 49. Whether the compensation amount is positive (+) or negative (−) is decided depending upon the sign of the difference between Y1 and Y2.

For example, in FIG. 4, Y2 is greater than Y1, and therefore, the difference has a negative (−) value. In this case, DMD26 to DMD50 have negative (−) compensation values, and DMD1 to DMD24 have positive (+) compensation values. In other words, it means that DMD26 to DMD50 have sync signals of narrow intervals, and DMD1 to DMD24 have sync signals of wide intervals.

The yawing amount calculated by Equation 1 above, for example, the compensation amount, is transmitted to the compensation amount calculation unit 57, which calculates an increment of the compensation amount to be compensated for by the respective DMDs (DMD1 to DMD50) 32 based on the calculated yawing amount (106).

When calculating the increment of the compensation amount, the previous compensation amount (K-1$^{th}$ compensation amount) is subtracted from the current compensation amount (K$^{th}$ compensation amount) acquired based on the yawing amount to prevent the compensation amount from being integrated. Also, compensation considering a yawing cycle is performed through sampling. Generally, the stage 10 has a yawing frequency of less than 10 Hz during scanning. When the scanning time of the stage 10 is 60 seconds, the yawing frequency is 1/6 Hz. Consequently, sufficient yawing compensation may be achieved through sampling at 100 Hz.

Subsequently, the second comparator 59 compares the increment of the compensation amount calculated by the compensation amount calculation unit 57 with an interferometer increment acquired by the third counter 58 (108). When the interferometer increment is less than the increment of the compensation amount, the compensation is continuously performed, sync signals (PEGs) of the respective DMDs 32 are generated according to the increment of the compensation amount, and the generated sync signals are transmitted to the respective DMDs 32 (110).

When it is determined at operation 108 that the interferometer increment is not less than the increment of the compensation amount, the compensation is stopped, sync signals (PEGs) of the respective DMDs 32 are generated according to the original increment (PEG amount), and the generated sync signals are transmitted to the respective DMDs 32 (112).

Consequently, the respective DMDs 32 are synchronized with the sync signals (PEGs) transmitted with the increment of the compensation amount or the original increment (PEG amount) to convert (switch) frames of the DMDs 32, thereby performing exposure (114).

As is apparent from the above description, in the disclosed maskless exposure apparatus and pattern compensation method using the same, requirements as to control performance of stage yawing through the adjustment of sync signals (PEGs) to switch frames of the DMDs are eliminated, thereby reducing manufacturing costs of a large-sized stage. Also, distortion of an exposure pattern, which may occur due to uncompensated yawing, is digitally compensated for by controlling the stage yawing, thereby achieving high-quality exposure.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A maskless exposure apparatus comprising:
   a plurality of digital micromirror devices (DMDs) configured to selectively irradiate light on a substrate according to pattern information;
   a stage configured to move the substrate in a scanning direction;
   a position measurement unit configured to measure at least two positions of the stage; and
   a sync signal generation unit configured to,
   average the at least two positions, acquire middle position data of the stage from the average, and generate sync signals (PEGs) to adjust drive timings of the DMDs according to the middle position data of the stage.

2. The maskless exposure apparatus according to claim 1, wherein the position measurement unit comprises a plurality of laser interferometers configured to measure the at least two positions of the stage.

3. The maskless exposure apparatus according to claim 2, wherein the sync signal generation unit is configured to, calculate a yawing amount of the stage based on a difference between position counters measured by the laser interferometers, and calculate a compensation amount for the yawing amount by the respective DMDs.

4. The maskless exposure apparatus according to claim 3, wherein the sync signal generation unit is configured to, generate a same number of sync signals (PEGs) as the DMDs, adjust generation intervals of the sync signals based on the calculated compensation amount, and transmit the sync signals having the adjusted generation intervals to the respective DMDs.

5. The maskless exposure apparatus according to claim 4, wherein the DMDs receive different sync signals (PEGs) from the sync signal generation unit to switch frames of the DMDs at different positions.

6. The maskless exposure apparatus according to claim 3, wherein the sync signal generation unit is configured to, compare an increment of the calculated compensation amount with an increment of the laser interferometers, and determine whether intervals of the sync signals (PEGs) require adjustment.

7. The maskless exposure apparatus according to claim 1, wherein the at least two positions include the left position and the right position of the stage.

8. A pattern compensation method of a maskless exposure apparatus, comprising:

moving a stage having a substrate located thereon in a scanning direction;

measuring at least two positions of the stage to calculate a yawing amount of the stage;

averaging the at least two positions;

acquire middle position data of the stage from the average, adjusting intervals of sync signals (PEGs) to drive a plurality of digital micromirror devices (DMDs) according to the middle position data of the stage; and transmitting the sync signals having the adjusted intervals to the DMDs to expose a pattern on the substrate.

9. The pattern compensation method according to claim 8, wherein the measuring comprises:

measuring the at least two positions using a plurality of laser interferometers.

10. The pattern compensation method according to claim 9, wherein the calculating the yawing amount of the stage comprises:

calculating the yawing amount of the stage based on a difference between at least two position counters of the stage corresponding to the at least two positions, and calculating a compensation amount for the yawing amount by the DMDs.

11. The pattern compensation method according to claim 8, wherein the transmitting the sync signals having the adjusted intervals to the DMDs to expose the pattern on the substrate comprises:

adjusting driving timings of the DMDs according to the intervals of the sync signals to prevent distortion of the exposure pattern.

12. The pattern compensation method according to claim 8, wherein the DMDs receive the sync signals (PEGs) having the adjusted intervals and associated switch frames to prevent distortion of the exposure pattern due to the yawing of the stage.

13. The pattern compensation method according to claim 8, wherein the at least two positions include the left position and the right position of the stage.

* * * * *